United States Patent
Liu et al.

(10) Patent No.: US 7,212,795 B2
(45) Date of Patent: May 1, 2007

(54) AUTOMATIC GAIN CONTROL AND ANTENNA SELECTION METHOD FOR A RADIO COMMUNICATION SYSTEM

(75) Inventors: Der-Zheng Liu, Tainan (TW); Song-Nien Tang, Kaohsiung (TW); Tai-Cheng Liu, Kaohsiung (TW); Kuang-Yu Yen, Taichung (TW)

(73) Assignee: Realtek Semiconductor Corp., Hsinchu (TW)

( * ) Notice: Subject to any disclaimer, the term of this patent is extended or adjusted under 35 U.S.C. 154(b) by 377 days.

(21) Appl. No.: 10/864,193

(22) Filed: Jun. 9, 2004

(65) Prior Publication Data

US 2004/0259511 A1  Dec. 23, 2004

(30) Foreign Application Priority Data

Jun. 20, 2003 (TW) ............................... 92116733 A

(51) Int. Cl.
*H04B 1/06* (2006.01)
(52) U.S. Cl. ............................ 455/232.1; 455/234.1; 455/273
(58) Field of Classification Search ............ 455/234.1, 455/232.1, 273, 274, 277.1, 250.1, 67.11, 455/67.13, 226.1, 239.1, 245.1, 253.2; 375/345
See application file for complete search history.

(56) References Cited

U.S. PATENT DOCUMENTS

| | | | |
|---|---|---|---|
| 5,339,452 A * | 8/1994 | Sugawara ................ 455/277.2 |
| 6,029,056 A * | 2/2000 | Kiyanagi et al. ........... 455/273 |
| 6,038,435 A | 3/2000 | Zhang ..................... 455/234.1 |
| 6,067,449 A * | 5/2000 | Jager ...................... 455/277.2 |
| 6,226,508 B1 * | 5/2001 | Takahashi et al. ....... 455/277.2 |
| 6,363,127 B1 | 3/2002 | Heinonen et al. ........... 375/345 |
| 6,560,448 B1 * | 5/2003 | Baldwin et al. ......... 455/234.1 |
| 6,574,292 B2 | 6/2003 | Heinonen et al. ........... 375/345 |
| 7,065,459 B2 * | 6/2006 | Kalinin et al. ........... 455/232.1 |
| 7,164,739 B1 * | 1/2007 | Trott ......................... 375/345 |
| 2002/0118724 A1 * | 8/2002 | Kishimoto et al. ....... 455/232.1 |
| 2004/0192242 A1 * | 9/2004 | Dinur et al. .............. 455/277.1 |
| 2005/0101252 A1 * | 5/2005 | Carvalho et al. ......... 455/63.11 |
| 2006/0121858 A1 * | 6/2006 | Tanaka et al. ............ 455/232.1 |

* cited by examiner

*Primary Examiner*—Lana Le
(74) *Attorney, Agent, or Firm*—Thomas, Kayden, Horstemeyer & Risley

(57) ABSTRACT

The invention provides an automatic gain control and antenna selection method used in a receiver of a radio communication system. The received signal power is estimated by digital signal processing after analog-to-digital conversion in the system, in order to adjust the gain of the front end analog signal until the magnitude of the analog signal is adjusted to an optimum range of the digital signal processing. In addition, the ADC is utilized to estimate the signal power as the basis of the antenna selection.

15 Claims, 2 Drawing Sheets ature of which is incorporated herein by reference.
AUTOMATIC GAIN CONTROL AND ANTENNA SELECTION METHOD FOR A RADIO COMMUNICATION SYSTEM This application claims the benefit of Taiwan application Serial No. 092116733, filed on Jun. 20, 2003, the subject matter of which is incorporated herein by reference.

BACKGROUND OF THE INVENTION

1. Field of the Invention

The invention relates in general to a radio communication system, and more particularly to a method for automatic gain control and antenna selection for a radio communication system.

2. Description of the Related Art

A receiver in a typical radio digital communication system includes at least an antenna, an analog module having radio frequency devices, and a digital signal processing (DSP) module, as shown in FIG. 1. In FIG. 1, a switch 12 switches between two antennas 10 and 11 to select one of them to receive the signal to accomplish antenna diversity. The antenna 10 or 11 receives the signal, which is then processed by the analog module 13 and converted into a digital signal to be transferred to a DSP module 14. The DSP module 14 estimates the power of the digital signal and thus outputs an automatic gain control (AGC) signal to the analog module 13 so as to adjust the gain thereof. On the other hand, the DSP module 14 also outputs a control signal to the switch 12 in order to switch the antenna to receive the signal according to the various conditions.

However, because the power variation range of the received signal of the antenna is quite large, the gain of the analog module 13 has to be properly controlled such that the signal sampled by the ADC (Analog-to-Digital Converter) of the analog module 13 can be properly processed by the DSP module 14. In order to adjust the gain of the analog module 13 in a digital control manner, the conventional way is to adjust the gain according to whether the signal exceeds a specific range of the ADC. In this way, a specific gain is decreased if the gain is greater than an upper limit of the range; and the specific gain is increased if the gain is smaller than a lower limit of the range. This conventional way is similar to the try and error method and has the advantage that it is unnecessary to calculate the signal power. However, the gain cannot be adjusted to the proper range until the adjustments have been tried several times, and it also takes a longer time to reach the stable state. If the antenna selection has to be performed simultaneously, the required time is unavoidably much longer.

However, in some radio communication system, such as the burst mode transmission system, the transmitted packet only has a relatively short preamble signal for the AGC's antenna selection. If the packet specified by the IEEE 802.11a/g is met, the conventional method may encounter some problems. In addition, the gain cannot be adjusted to the proper range in a relatively short time, and there is no time left for the switching to the proper antenna.

SUMMARY OF THE INVENTION

It is therefore one of the objects of the invention to provide a method for rapidly performing the automatic gain control.

Another object of the invention is to provide a method for rapidly performing the automatic gain control and antenna selection.

The invention achieves the above-identified objects by providing a method for rapidly performing the automatic gain control and antenna selection, and the method is applied to a receiver of a radio communication system. The receiver includes an N-bit ADC, an amplification unit for adjusting a power of an analog signal of the receiver, and first and second antennas. The method includes the steps of: (a) setting an initial gain of the amplification unit; (b) selecting the first antenna to receive a signal and checking whether ADC saturation occurs by comparing a digital signal outputted from the ADC with a saturation threshold value; (c) performing an antenna selection procedure to select one of the first and second antennas to receive the signal if ADC saturation does not occur; (d) decreasing the gain of the amplification unit by a first value until the digital signal is smaller than the saturation threshold value if ADC saturation occurs, wherein an absolute value of the first value is smaller than or equal to $(N-m) \cdot p$, m is an integer greater than or equal to 0, and p is a power multiple represented by each bit of the ADC; and (e) estimating the power of the signal according to the digital signal so as to adjust the gain of the amplification unit selectively.

In this method, the initial gain is configured such that the minimum power signal received by the receiver and processed by the amplification unit at least covers m least significant bits (LSB) of the ADC. In step (e), if the absolute value of the estimated power of the signal is smaller than a default threshold, it is selected that the gain of the amplification unit is not adjusted.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
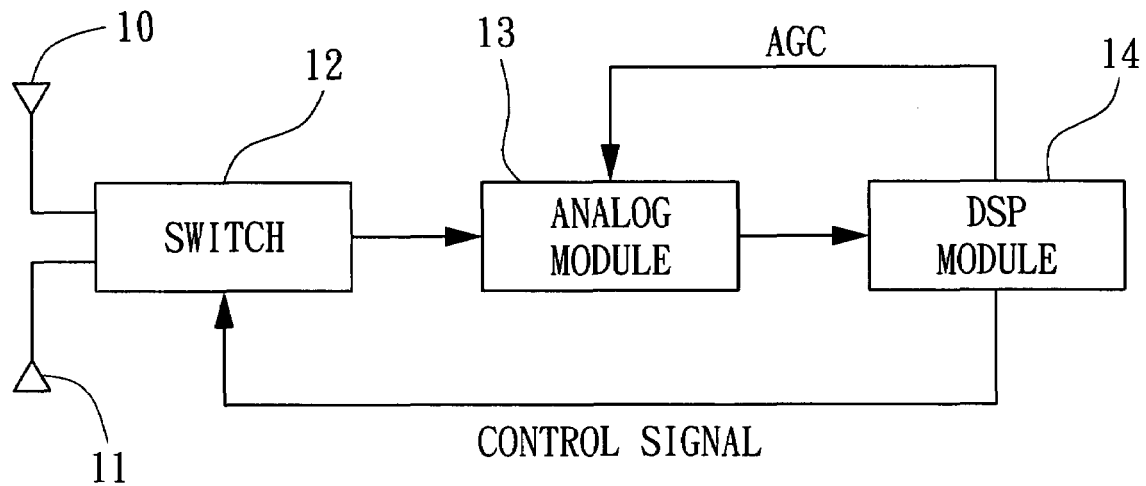
FIG. 1 is a block diagram showing a receiver in a conventional digital radio communication system.
Figure 2:
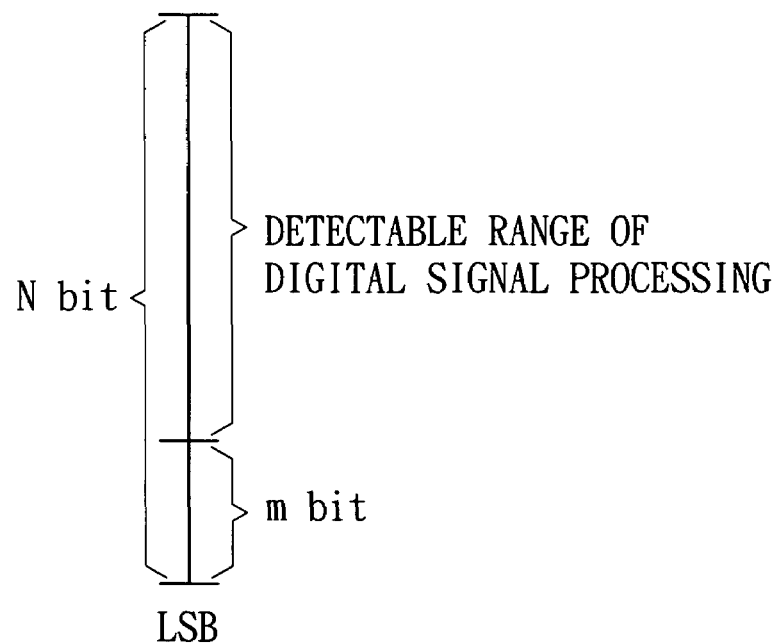
FIG. 2 is a schematic illustration showing the ADC's output bit range of the measurable sampling signal power.

The invention may be implemented in a receiver of a radio communication system in order to perform the automatic gain control (AGC) and the antenna selection in a short period of time. In terms of the ADC, the system needs a greater bit number, but the required bit number for estimating the signal power is smaller, as shown in FIG. 2. In FIG. 2, it is assumed that the ADC has the resolution of N bits. When the signal exceeds m least significant bits (LSBs) but does not exceed the maximum input range of the ADC, the magnitude of the ADC's sampling signal power may be measured. The selection of m relates to whether the receiver can correctly perform the carrier sense or power estimation. The receiver determines whether the received signal exceeds the ADC's input range (i.e., whether the ADC is saturated) as it detects the signal input through the carrier sense. If the ADC is saturated, it represents that the power of the received signal is too large, and it is unnecessary to switch the antenna in order to obtain the received signal with larger power. If the unit of the power is dBm, the power of the received signal can be represented by [x+(N−m)·p] dBm, wherein x denotes the to-be-detected power magnitude of the minimum signal, and p denotes the power multiple represented by each bit of the ADC. In the binary number system, adding one bit corresponds to multiplication by 2. Therefore, the power multiple p represented by each bit is 4 (the square of 2), and may be converted into the dB value approximating 6. If the ADC is saturated, the power level of the received signal is larger than [x+(N−m)·p] dBm.

If the received signal still falls within the ADC's input range, it is possible to firstly estimate whether the signal power is large enough so as to determine whether the antenna selection operation has to be performed. If the signal power is large enough, the gain is adjusted directly according to the magnitude of the estimated signal power. If the signal power is not large enough, it is necessary to switch to another antenna so as to estimate the magnitude of the signal received by another antenna and compared the magnitude with the former. Then, the antenna that receives the larger signal is selected, and the gain is determined according to the magnitude of the estimated signal power.

When the to-be-used antenna has been determined and the received signal still makes the ADC saturate, the gain has to be decreased, and the decrease is determined according to the detectable range of the digital signal processing, as shown in FIG. 2. Because the detectable range is [(N−m)×6] dB in this embodiment, the gain [(N−m)×6] dB is decreased and then the detection is made. After the decrease of the gain, if the received signal cannot make the ADC saturate, the magnitude estimation of the signal power and the corresponding gain adjustment are continuously performed. If the received signal still makes the ADC saturate, the gain [(N−m)×6] dB is repeatedly decreased until the magnitude of the received signal falls within the detectable range of the digital signal processing.

Therefore, when the invention is implemented, a proper antenna may be selected to receive the signal, and then the gain of the analog circuit is greatly adjusted until the magnitude of the signal falls within the detectable range of the digital signal processing. Next, the magnitude of the sampling signal power is estimated in order to correctly adjust the gain required by the analog circuit.

In one embodiment, the invention discloses an automatic gain control and antenna selection method applied to a receiver of a radio communication system. The receiver includes an N-bit ADC, an amplification unit for adjusting the power of the analog signal of the receiver, and first and second antennas. According to this method, it is possible to determine which one of the antennas can receive the signal with larger power and then to determine the gain of the amplification unit. The amplification unit includes a low-noise amplifier (LNA) for adjusting the power of the radio frequency (RF) signal, and the LNA has switchable high and low gain modes. The amplification unit also includes an amplifier for adjusting the powers of the intermediate frequency (IF) signal and the baseband (BB) signal. In this embodiment, a variable gain amplifier (VGA) is utilized.

Figure 3:
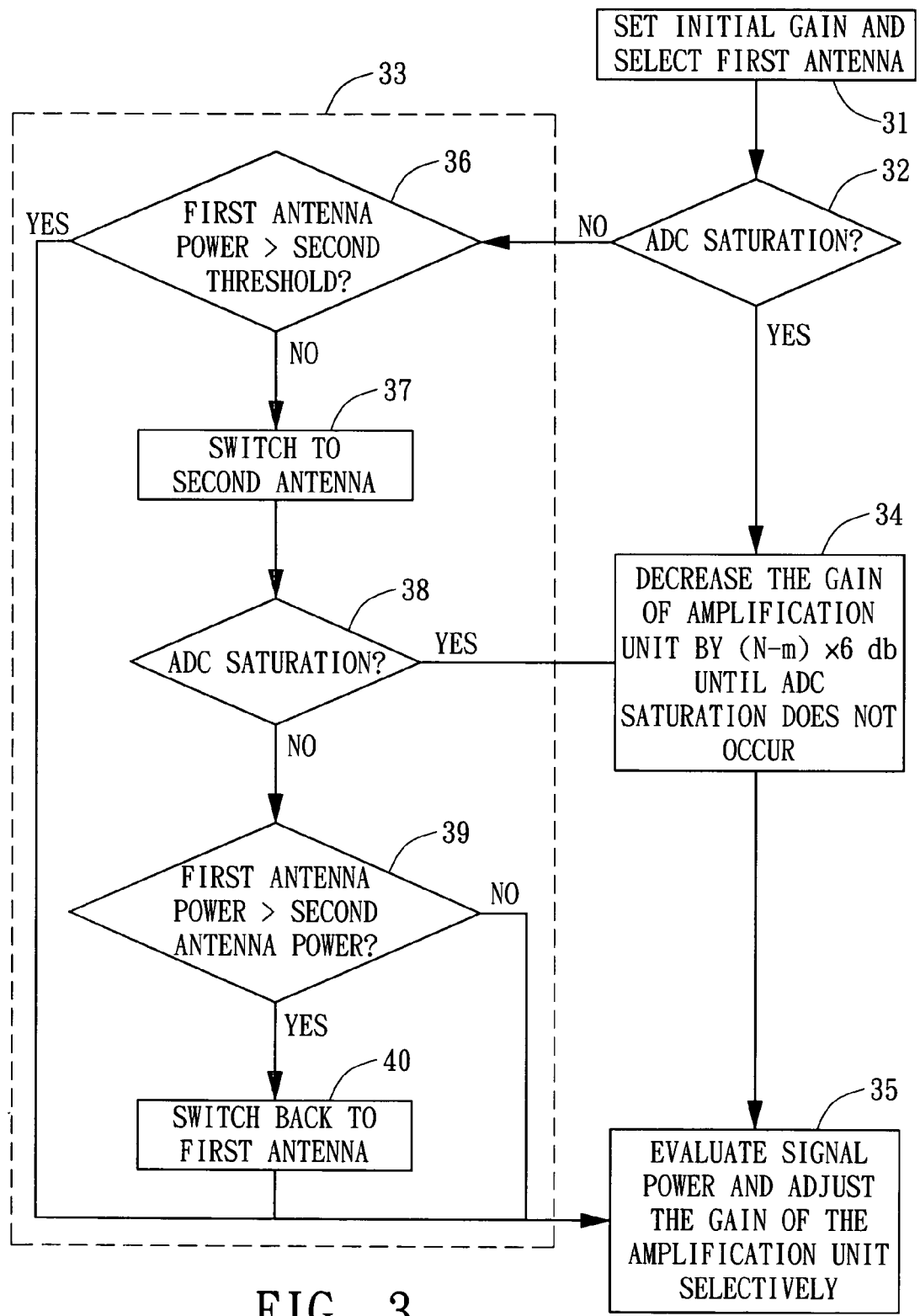
FIG. 3 is an operational flowchart showing the method of the invention for performing the automatic gain control and the antenna selection.

FIG. 3 is an operational flowchart showing the method of the embodiment of the present invention for performing the automatic gain control and the antenna selection. In step 31, an initial gain of the amplification unit is set and the first antenna is selected to receive a signal. That is, the received signal (analog signal) is amplified by the amplification unit with the initial gain. In step 32, it is checked whether the digital signal outputted from the ADC is not smaller than a saturation threshold value. If the digital signal is smaller that the saturation threshold value, it indicates that ADC saturation does not occur and an antenna selection procedure, as described in step 33, is performed for selecting one of the first and second antennas to receive the signal. If the digital signal is not smaller that the saturation threshold value, it indicates that ADC saturation occurs, and the gain of the amplification unit, as indicated in step 34, is decreased by (N−m)×6 dB until the digital signal is smaller than the saturation threshold value. The power of the signal is then estimated, as indicated in step 35, according to the digital signal so as to adjust the gain of the amplification unit selectively.

The antenna selection procedure of step 33 includes the following steps. In step 36, it is checked whether the power received by the first antenna is greater than a second power threshold value. If so, the method proceeds to step 35. If not, the method proceeds to step 37. In step 37, the second antenna is switched to so as to receive the signal. It is then checked in step 38 whether the digital signal is not smaller than the threshold. If the digital signal is not smaller than the threshold, it indicates that ADC saturation occurs and the method proceeds to step 34; otherwise, the method proceeds to step 39. In step 39, it is checked whether the power received by the first antenna is greater than that received by the second antenna. If so, the method proceeds to step 40, otherwise step 35. In step 40, the first antenna is switched back to and the method proceeds to step 35.

Step 31 performs the initialization operation. The initial gain enables the receiver to receive a minimum power signal, which at least covers m LSBs of the ADC after being processed by the amplification unit and the ADC. Herein, the setting of the initial gain includes setting the LNA to the high gain mode.

Step 34 coarsely adjusts the gain of the amplification unit. Because the total gain of the amplification unit is composed of the gains of the LNA and the VGA, each decreasing gain of the amplification unit is equal to the summation of the gain adjustments of the LNA and the VGA. In order to speed up the AGC, the embodiment creates a lookup table for recording the corresponding relationship between the total gain of the amplification unit and the (LNA gain mode+ VGA gain). Thus, when the gain of the amplification unit is adjusted, it can be known from the look-up-table that whether the LNA's gain mode and the VGA's gain adjustment have to be switched.

Hence, in step 34, when the gain of the amplification unit is decreased, the VGA's gain adjustment is (N−m)×6 dB if it is known from the look-up-table that the LNA need not to be switched to the low gain mode; and the VGA's gain adjustment equals to a value obtained by subtracting the gain variation of the LNA, which is switched from the high gain mode to the low gain mode, from (N−m)×6 dB if the LNA need to be switched to the low gain mode.

Of course, the step of determining whether the LNA is switched to the low gain mode may be performed according to the table look-up method in conjunction with other associated information, such as the received signal strength indication (RSSI). When the RSSI is smaller than a specific threshold, the received signal intensity is low, and the LNA is not suitable to be set to the low gain mode. Conversely, when the RSSI is higher than the specific threshold, the LNA may be changed to the low gain mode.

In step 35, if the absolute value of the estimated power of the signal is smaller than a first power threshold value, the gain of the amplification unit is not adjusted, and thereby completing the AGC and the antenna selection. Herein, the first power threshold value is the allowable signal power error. Conversely, if the absolute value is not smaller than the first power threshold value, the table-look-up method is performed, and the gain of the amplification unit is adjusted according to the table-look-up result, wherein the adjustment is smaller than that in step 34.

The antenna selection procedure performed in steps 36 to 38 relates to the embodied implementation of the antenna selection. The selection of the second power threshold value in step 36 depends on the allowable gain error of the receiver.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for performing an automatic gain control (AGC) and an antenna selection in a receiver of a radio communication system, the method comprising the steps of:
   receiving an analog receiving signal by one of a first antenna and a second antenna of the receiver;
   amplifying the analog receiving signal by an amplification unit with a gain;
   converting the analog receiving signal into a digital receiving signal by an N-bit analog-to-digital converter (ADC);
   comparing the digital receiving signal with a saturation threshold value;
   decreasing the gain of the amplification unit by an adjusting value if the digital receiving signal is larger than or equal to the saturation threshold value; and
   selecting one of the first and the second antenna to receive the analog receiving signal if the digital receiving signal is smaller than the saturation threshold value, wherein the saturation threshold value corresponds to N.

2. The method according to claim 1, wherein the gain is determined such that a power of the analog receiving signal received by the receiver is larger than a first power threshold value.

3. The method according to claim 2, wherein the adjusting value is determined by at least one of the saturation threshold value and the first power saturation threshold value.

4. The method according to claim 1, wherein in the selecting step, the step further comprises the steps of:
   comparing the power of the analog receiving signal received by the first antenna and the power of the analog receiving signal received by the second antenna; and
   selecting one of the first and the second antenna according to the result of comparing.

5. The method according to claim 1, wherein in the selecting step, the step further comprises the steps of:
   determining whether the power of the analog receiving signal received by the one of the first and the second antennas is larger than a second power threshold value;
   selecting the other one of the first and the second antennas to receive the analog receiving signal if the power of the analog receiving signal is smaller than the second power threshold value;
   comparing the power of the analog receiving signal received by the first antenna and the power of the analog receiving signal received by the second antenna; and
   selecting one of the first and the second antenna according to the result of comparing.

6. An apparatus for performing an automatic gain control (AGC) and an antenna selection in a receiver of a radio communication system, the apparatus comprising:
   a first antenna;
   a second antenna;
   a switch for selecting one of the first and the second antennas to receive an analog receiving signal;
   an amplification unit with a gain for amplifying the analog receiving signal;
   an N bits ADC for converting the analog receiving signal into a digital receiving signal; and
   a DSP module further comprising:
   a gain control unit for decreasing the gain of the amplification unit if the value of the digital receiving signal is larger than N bits; and
   a switch control unit for selecting one of the first and the second antenna to receive the analog receiving signal if the value of the digital receiving signal is smaller than N bits.

7. The apparatus according to claim 6, wherein the gain is determined such that the value of the digital receiving signal converted from the analog receiving signal is no smaller than m bits, wherein m is smaller than N.

8. The apparatus according to claim 7, wherein the amplification unit further includes a low noise amplifier (LNA) for amplifying the analog receiving signal of ratio frequency (RF) and a variable gain amplifier (VGA) for amplifying the analog receiving signal of intermediate frequency (IF) or baseband (BB), wherein the LNA at least has a high gain mode and a low gain mode.

9. The apparatus according to claim 8, wherein the gain is determined by the sum of the gain of LNA and the gain of the VGA and the gain is decreased by decreasing at least one of the gain of LNA and the gain of the VGA.

10. The apparatus according to claim 9, wherein the gain is decreased by switching the LNA from the high gain mode to the low gain mode.

11. The apparatus according to claim 9, wherein the gain is decreased by decreasing the gain of the VGA by an adjusting value.

12. The apparatus according to claim 11, wherein the adjusting value is determined to be no larger than $(N-m) \cdot p$ dB, wherein p is a power multiple represented by each bit of the ADC.

13. The apparatus according to claim 12, wherein p is 6.

14. The apparatus according to claim 6, wherein the switch control unit selects one of the first and the second antennas through comparing the power of the analog receiving signal received by the first antenna and the power of the analog receiving signal received by the second antenna.

15. The apparatus according to claim 6, wherein the gain is determined by setting the LNA to the high gain mode when a received signal strength indication (RSSI) of the analog receiving signal is smaller than a threshold.

* * * * *